(12) United States Patent
Fournel et al.

(10) Patent No.: US 8,841,202 B2
(45) Date of Patent: Sep. 23, 2014

(54) METHOD OF PRODUCING A HYBRID SUBSTRATE BY PARTIAL RECRYSTALLIZATION OF A MIXED LAYER

(75) Inventors: Franck Fournel, Villard-Bonnot (FR); Thomas Signamarcheix, La Terrasse (FR); Laurent Clavelier, Saint Egreve (FR); Chrystel Deguet, Saint Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 748 days.

(21) Appl. No.: 12/705,039

(22) Filed: Feb. 12, 2010

(65) Prior Publication Data

US 2010/0221891 A1 Sep. 2, 2010

(30) Foreign Application Priority Data

Feb. 27, 2009 (FR) ..................... 09 51247

(51) Int. Cl.
*H01L 21/30* (2006.01)
(52) U.S. Cl.
USPC .................................. 438/458; 257/E21.211
(58) Field of Classification Search
CPC ............ H01L 21/187; H01L 21/76254; H01L 21/76275; H01L 21/84; H01L 29/045
USPC ............................ 438/455–459; 257/E21.211
See application file for complete search history.

(56) References Cited

U.S. PATENT DOCUMENTS

| | | | | |
|---|---|---|---|---|
| 5,436,174 | A | * | 7/1995 | Baliga et al. .................. 438/705 |
| 2005/0009288 | A1 | * | 1/2005 | Cheng et al. .................. 438/407 |
| 2005/0101095 | A1 | * | 5/2005 | Fournel et al. ................ 438/305 |
| 2005/0116290 | A1 | | 6/2005 | De Souza et al. |
| 2006/0024931 | A1 | | 2/2006 | Chan et al. |
| 2006/0166461 | A1 | | 7/2006 | Fournel et al. |
| 2007/0013001 | A1 | | 1/2007 | Furukawa et al. |
| 2008/0079123 | A1 | | 4/2008 | Kostrzewa et al. |
| 2008/0188046 | A1 | * | 8/2008 | Hierlemann et al. ......... 438/221 |

FOREIGN PATENT DOCUMENTS

FR 2 917 235 A1 12/2008

OTHER PUBLICATIONS

French Preliminary Search Report, mailing date Sep. 29, 2009 (2 pgs).

"High Performance CMOS Fabricated on Hybrid Substrate With Different Crystal Orientations" by Yang, Ieong, Shi, Chan, Chan, Chou, Gusev, Jenkins, Boyd, Ninomiya, Pendleton, Surpris, Heenan, Ott, Guarini, D'Emic, Cobb, Mooney, To, Rovedo, Benedict, Mo, Ng, published in IEDM Mar. 2003 pp. 453-456.

(Continued)

*Primary Examiner* — Duy T Nguyen
(74) *Attorney, Agent, or Firm* — Brinks Gilson & Lione

(57) ABSTRACT

A method of producing a hybrid substrate includes preparing a monocrystalline first substrate to obtain two surface portions. A temporary substrate is prepared including a mixed layer along which extends one surface portion and is formed of first areas and adjacent different second areas of amorphous material, the second areas forming at least part of the free surface of the first substrate. The first substrate is bonded to the other surface portion with the same crystal orientation as the first surface portion, by molecular bonding over at least the amorphous areas. A solid phase recrystallization of at least part of the amorphous areas according to the crystal orientation of the first substrate is selectively carried and the two surface portions are separated.

15 Claims, 2 Drawing Sheets

(56) References Cited

OTHER PUBLICATIONS

"Silicon-on-isolator MOSFETs with Hybrid Crystal Orientations" by Yang, Chan, Kumar, Lo, Sleight, Chang, Rao, Bedell, Ray, Ott, Patel, D'Emic, Rubino, Zhang, Shi, Steen, Sikorski, Newbury, Meyer, To Kozlowski, Graham, Maurer, Medd, Canaperi, Deligianni, Tornello, Gibson, Dalton, Ieong, Shabidi published in Symposium on VLSI Technology Digest of Technical Papers, 2006.

* cited by examiner

METHOD OF PRODUCING A HYBRID SUBSTRATE BY PARTIAL RECRYSTALLIZATION OF A MIXED LAYER

RELATED APPLICATIONS

This application claims the benefit of priority to French Patent Application No. 0951247, filed Feb. 27, 2009, which is incorporated by reference herein.

TECHNICAL FIELD

The invention concerns a method of formation of a hybrid substrate, that is to say a micro-technological structure including a mixed layer formed of families of different areas, where their constituent materials are concerned or at least where their crystalline orientations are concerned. Such a substrate is sometimes also called a "mixed substrate", because of the mixing of areas within the same layer.

It is to be noted that the thickness of a mixed layer is typically between 1 nm and 50 µm inclusive.

BACKGROUND

In the field of micro-technology, if it is a question of producing electronic, optical or opto-electronic components, or even micro-mechanical components (for example micro-accelerators), silicon substrates are often used, but it must be clearly understood that other materials are equally usable, often other semiconductor materials, formed of elements from column IV of the periodic table of the elements (especially germanium and its alloys with silicon), columns III-V of that table (especially GaAs or InP), or even columns II-VI of that table, even LiNbO3, SiC, diamond, and the like.

The use, and more particularly the production, of such hybrid substrates, whether the mixed layer is buried or on the surface, is of interest for diverse applications, especially MOS type devices.

In this latter case, given the limitations of MOSFET devices in terms of performance, the change of the crystalline orientation of the surface of the substrate used (mostly Si), just like the change of the direction of the conduction channel of the transistors, appears as a simple and effective solution. Many studies have demonstrated the impact of the orientation of the free surface and the direction of the conduction channel on the respective mobilities of holes and electrons. Thus improving the mobility of the carriers (holes) can be obtained via the use of a free surface of orientation <110> in comparison with a standard free surface of type <100>, as recently reported by Yang et al. (see reference 1 below). However, the CMOS technology is based on the simultaneous use of n-MOS type transistors (conduction by electrons) and p-MOS type transistors (conduction by holes). Furthermore, a change of the orientation of the surface has antagonistic effects on the electrons and on the holes, thus necessitating two free surface orientations, different for these two types of carrier. Thus it is necessary to be able to produce and to make cohabit two types of orientation on the same substrate.

Clearly, depending on the intended applications, the hybrid layer can extend along an electrically insulative layer or not.

Techniques for production of hybrid structures are already known.

See, for example, PCT patent publication No. WO-2004/059711 or its US equivalent U.S. patent publication No. 2006/0166461, which proposes the formation of a mixed or hybrid structure by molecular bonding of two substrates one of which has on its surface two types of areas differing in terms of their constituent materials; in the above document, these two types of areas are obtained by techniques of lithography, etching, thermal oxidation of the surface and polishing so that thermal oxide remains only in etched areas. An improvement on this technique is proposed in the European patent publication No. EP-1 923 912 or its US equivalent U.S. patent publication No.-2008/0079123, which teaches the formation of a sacrificial layer guaranteeing the flatness of the surfaces finally laid bare.

Moreover, the article "High Performance CMOS Fabricated on Hybrid Substrate With Different Crystal Orientations" by Yang, Ieong, Shi, Chan, Chan, Chou, Gusev, Jenkins, Boyd, Ninomiya, Pendleton, Surpris, Heenan, Ott, Guarini, D'Emic, Cobb, Mooney, To, Rovedo, Benedict, Mo, Ng, published in IEDM 03-2003 pp. 453-456 proposes, instead of using thermal oxidation to fill the etched areas, excavation by etching of cavities in an SOI substrate (in particular, one with a semiconductor layer on top of a buried electrically insulative layer), through the insulative layer, and to cause these cavities to be filled epitaxially from the bottom of these etched areas, which consists of a material (under this insulative layer) chosen to have a different crystallography to unetched areas. This technique is discussed in more detail in "Hybrid-Orientation Technology (HOT); Opportunities and Challenges" by Yang, Chan, Chan, Shi, Fried, Stathis, Chou, Gusev, Ott, Burns, Fischetti, Ieong published in IEEE Transaction on Electron Devices, Vol. 53, No. 5, May 2006, pp. 965-978.

In another article, Yang et al. have shown through simulation the importance of providing a buried continuous electrical insulator under the areas with different orientations and have proposed a modification of their production method (as defined in reference 2) aiming to minimize interruptions of the electrically insulative buried layer; this modification consists in providing for the etching through the electrically insulative buried layer to be effected over a section smaller than that of the cavity excavated in the layer situated on top of this insulative layer. "Silicon-on-isolator MOSFETs with Hybrid Crystal Orientations" by Yang, Chan, Kumar, Lo, Sleight, Chang, Rao, Bedell, Ray, Ott, Patel, D'Emic, Rubino, Zhang, Shi, Steen, Sikorski, Newbury, Meyer, To Kozlowski, Graham, Maurer, Medd, Canaperi, Deligianni, Tornello, Gibson, Dalton, Ieong, Shabidi published in Symposium on VLSI Technology Digest of Technical Papers, 2006.

It is nevertheless clear that epitaxial deposition is a technique subject to relatively strict operating constraints, which sometimes generates a significant cost.

Another production technique is described by Yin et al.; this technique is based on using a DSB (Direct Silicon Bonding) structure, that is to say one obtained by direct bonding of two silicon substrates with different crystalline orientations: by lithography and ion implantation, areas of one of the substrates are selectively rendered amorphous throughout its thickness as far as the interface between the two substrates, and the areas rendered amorphous are caused to recrystallize according to the crystallography of the other substrate; it is stated that unless, before recrystallization, trenches are formed between the areas rendered amorphous and the areas that have not been rendered amorphous, two competing recrystallization phenomena are observed, starting from the underlying substrate (with a first crystal orientation) and starting from adjacent areas (with another crystal orientation). "Direct Silicon Bonded (DSB) Substrate Solid Phase Epitaxy (SPE) Integration Scheme Study for High Performance Bulk CMOS" by Yin, Sung, Ng, Saenger, Chan, Crowder, Zhang, Li, Ott, Pfeiffer, Bendernagel, Ko, Ren, Chen, Wang, Liu, Cheng, Mesfin, Kelly, Ku, Luo, Rovedo, Fogel, Sadana, Khare, Shahidi, published in 1-4244-0439-8/06/ $20.00 © 2006 IEEE This principle of solid phase recrystallization appears to have significant advantages, especially in terms of cost, relative to the epitaxial technique, but it is therefore clear that using a mixed layer for fabrication does not achieve precise control of the microstructure of the areas initially amorphous near the other areas; the final geometry of the initially amorphous areas of the mixed layer depends, unless trenches are provided between the adjacent areas, on competition between tangential recrystallization starting from "other" areas and vertical crystallization starting from the underlying substrate, which can lead to involuntary trapezoids. More generally, it can be important to be able to guarantee that the mixed layer has substantially the same geometry and/or the same structure in terms of lower and upper edges as those other areas.

SUMMARY

Note that the technologies referred to above concern the production of hybrid substrates in which the mixed layer is on the surface, but it is clear that it can also be useful to be able to produce hybrid substrates in which the mixed layer is a layer buried under another layer that in practice is crystalline.

The subject matter of the invention is a method for producing, simply and reliably, a hybrid substrate including an underlying substrate and a mixed layer formed of families of different adjacent areas such that the areas of each family consist of a predetermined material having a specific crystallography (from the crystal orientation point of view and/or the lattice parameter point of view, an amorphous form being treated here the same as a crystallographic form), in accordance with a well-controlled geometry. The number of families of areas is often two, but it is clear that in some cases it can be useful to be able to obtain such a layer including areas having, in a predefined way, one of three (or more) different orientations.

Thus the invention proposes a method of producing a hybrid substrate in which:

a first substrate is prepared at least one layer of which is monocrystalline in a first material, this first substrate is separated into two substrate parts, this separation freeing two surfaces of two surface portions the crystalline axes of which coincide perfectly on separation, a temporary substrate is prepared by forming on said surface of a first of these two surface portions a mixed layer that is formed of first areas in at least one second material and adjacent second areas in an amorphous third material, these second areas having a difference of composition and/or of crystallographic form with respect to the first areas and forming at least part of the free surface of this temporary substrate, there is bonded to this temporary substrate, by molecular bonding over at least these amorphous areas, said surface of the second of the surface portions of the first substrate laid bare, so that it has the same crystal orientation as the first surface portion, and there is applied at least to the mixed layer a heat treatment adapted to cause, selectively with respect to the first areas, solid phase recrystallization of at least part of the amorphous areas according to the common crystal orientation of the two surface portions.

The surface portions advantageously have parallel faces inside the monocrystalline layer.

Advantageously, before provoking the fracture, advantageously along a previously weakened area, registration marks are produced in the first substrate adapted to be disposed on either side of the fracture area (thus on either side of this weakened area that is advantageous at the time of this fracture), in accordance with a relative configuration given with respect to the fracture layer, and the second surface portion is bonded to the temporary substrate after placing this second portion so that the registration marks are in said given relative configuration relative to said mixed layer. In practice this given relative configuration corresponds to a disposition of these marks perpendicularly facing this fracture layer (and thus this mixed layer). This contributes to guaranteeing that the two surface portions are in the same relative orientation before fracture and after bonding. These marks can be simple visual markers or recesses, grooves or other localized geometry modifications.

Equally advantageously, after bonding the second surface portion, at least one (or even both) of the surface portions is removed at least in part from the mixed layer, which enables the mixed layer to be at a clearly defined, possibly null depth, relative to a surface laid bare by this removal. This removal can be effected by separating the surface portion and the areas at least in part recrystallized of the mixed layer, or by mechanical and/or chemical thinning.

Note that the invention thus teaches causing recrystallization of amorphous areas not only from an underlying substrate (the portion of the initial substrate on which the mixed layer has been formed), but also from a reference layer (the other portion of the initial substrate) attached by molecular bonding (possibly only temporarily). Given that this underlying substrate and this reference layer are produced from the same starting substrate and that, at the moment of bonding the second surface area, it is the facing faces resulting from the separation that are assembled on either side of the mixed layer with the same orientation as before separation (thanks to the alignment of the registration marks, if any, produced before separation), the invention minimizes the risk of crystallographic misalignment (both in and outside the assembly plane) upon the selective recrystallization fronts of the amorphous areas encountering each other, from the underlying substrate and from the overlying reference layer.

The two surface portions are advantageously obtained by the technique known as the "Smart Cut™" technique, by making the starting substrate fragile, at a given depth, inside the monocrystalline layer, by implantation of ions such as hydrogen ions or helium ions, for example, possibly followed by bonding to a carrier substrate (if this is beneficial) followed by application of thermal and/or mechanical energy to cause separation in the implanted area. This separation can optionally be followed by a step of polishing the surfaces laid bare in this way.

The invention dispenses with the need to recrystallize the amorphous areas throughout their thickness; the fact that there are two recrystallization fronts guarantees that these areas are recrystallized in the same manner near the two surface portions, on both sides of the mixed layer, even if there remains a median fraction of the amorphous layers that has not recrystallized. Recrystallization can then continue with another annealing before or after removal of all or part of one of the surface portions.

It is interesting to note that, because there is removed by separation the reference layer forming the seed layer of the hybrid substrate, this reference layer can be used for a new separation and hybrid substrate formation cycle.

Clearly, if it is not required that the crystal seed layer be fixed only temporarily before being removed by separation, it is advantageous for the separation of this layer from the mixed layer to be effected, after recrystallization, by separation at the bonding interface or by fracture near it; this is why, advantageously, either the mechanical strength of the interface is intentionally reduced, or the mechanical strength of the crystal seed layer is intentionally reduced near this bonding interface. However, in contrast to what might have been feared, it is apparent that such weakening, or fragilization, does not prevent the reference layer fulfilling effectively its seed layer function for recrystallization across the interface.

Degrading the bonding interface in this way, with the aim of reducing the bonding energy despite the consolidation that normally occurs because of heat treatment such as the recrystallization treatment, can in particular be effected by a treatment roughening one and/or the other of the faces intended to be bonded by molecular bonding; for practical reasons it is advantageous to roughen the free surface of at least the reference layer.

The roughness obtained in this way is advantageously between 0.1 nm and 1 nm RMS, for example of the order of 0.2 nm RMS (as determined by atomic force measurement (AFM), for example over an area 5 microns×5 microns). This roughening is advantageously obtained by etching, for example, at least in the case of a monocrystalline silicon layer, in a solution of water, ammonium hydroxide and oxygenated water (H2O, NH4+/OH— and H2O2 in proportions of 1-1-5 at 70° C. for 15 minutes (it will be evident to the person skilled in the art how to chose an appropriate solution for each material to be etched)).

Instead of modifying the roughness of the layers intended to be bonded, a sacrificial layer can be provided between these two surfaces, provided that this surface retains the crystalline information to be transmitted and thus enables the crystal seed layer to exercise its recrystallization role. For example, this sacrificial layer can be an alloy grown epitaxially on the crystal seed layer, for example $Si_xGe_{(1-x)}$; where it is required to recrystallize amorphous portions of silicon using a monocrystalline silicon crystal seed, this layer must be thinner than the critical thickness (the thickness up to which SiGe increases with the lattice parameter of the underlying silicon, thus preserving the crystalline information of the silicon; for $Si_{0.8}Ge_{0.2}$ on Si, a typical thickness limit is 5 nm). After bonding and recrystallization annealing, to obtain separation it then suffices to eliminate a large part of the crystal seed substrate, for example by mechanical levelling or by fracturing a buried fragile area produced beforehand in the crystal seed substrate, after which one or more selective attack solutions of any appropriate type known in the art is employed to eliminate the residual crystal seed portion, if any, and then the sacrificial layer of SiGe (one solution known in the art for selectively etching SiGe relative to silicon is HF/HNO3, for example).

To facilitate separation, the thermal recrystallization budget can also be limited (which tends at the same time to strengthen the bonding interface). For example, only a small portion of the amorphous areas can be recrystallized, in practice a portion of the thickness thereof, starting from the bonding interface, to limit the time of application of the recrystallization treatment, then to continue with separation (as long as the bonding interface has a moderate strength), then continuing and completing the recrystallization of the amorphous areas by applying a complementary thermal budget. This limits the pre-separation thermal budget (and therefore guarantees that the structure will be separable) as well as transferring the crystalline information "from the other side" via the bonding interface. Remember that the thermal budget concept encompasses both the temperature of a treatment and its duration.

Such recrystallization in two processing steps, where the first treatment is adapted to cause recrystallization of only part of the amorphous areas (in practice part of the thickness) and, after separation, applying a second heat treatment (or even more than one heat treatment) adapted to continue and complete the recrystallization of these amorphous areas, also has an energy advantage, regardless of where the separation is effected, because the complementary heat treatment does not need to be applied to the crystal seed layer.

Clearly, although it is advantageous, it is not necessary for recrystallization to be obtained everywhere in the area to be recrystallized over the same part of the thickness thereof; it suffices for the part of these areas that is recrystallized to be sufficiently large to serve as a crystal seed for the rest of the area during heat treatment after separation.

One way to mechanically weaken the reference layer is to make at least part of that layer porous, near the interface. In fact it is not necessary for this porous area to be exactly adjacent this interface, although this is advantageous to enable a fracture very close to the interface. Clearly, if the separation occurs at a distance from the interface, standard mechanical and/or chemical and/or thermal polishing treatment can eliminate the residue of the reference layer after fracture in the porous layer.

The reference layer can instead be made fragile at a given depth by ion implantation, using the technique known as the "Smart Cut™" technique. Such implantation is advantageously effected before bonding, so that the weakening resulting from implantation can grow during the recrystallization heat treatment. Separation thereafter occurs in this fragile layer.

This reference layer preferably has a thickness between a few nanometers and several hundred microns.

The first constituent material of the initial substrate (thus that of the underlying substrate and of this reference layer) is advantageously identical to that of the amorphous areas (third material), the effect of which is that the amorphous areas recrystallize according to a lattice parameter that is natural for this material. Nevertheless, there can be chosen for this initial substrate a material different from that of the amorphous areas, for example if it is required to recrystallize these amorphous areas in a stressed state; for example, using relaxed $Si_{0.8}Ge_{0.2}$ for the reference layer contributes to recrystallizing the amorphous areas of silicon stressed in tension.

The second constituent material of the first areas can advantageously be an amorphous material such as an oxide, a nitride, alumina, carbon or some other material with a high dielectric constant (referred to as "high K" materials); note in this regard that oxides and nitrides often have very high recrystallization temperatures (if any) and crystalline phase change temperatures, so that heat treatment intended to recrystallize the second areas can be insufficient in itself, at least in some cases, to cause recrystallization of these oxide or nitride areas in amorphous form. Alternatively, the second constituent material of the first areas can be a crystalline (monocrystalline or polycrystalline) material such as silicon or any other semiconductor material, such as germanium or one of its alloys with silicon, other silicon alloys such as SiC, or alloys of elements from columns III and V of the periodic table of the elements (for example GaAs), or even from columns II and VI, or diamond, quartz, LiTaO3, LiNbO3, and the like. Obviously it is recommended in this situation to take care that lateral recrystallization phenomena do not disturb vertical recrystallization. This can occur naturally if the lattice parameters are sufficiently different; if not, it is recommended to prevent crystalline contact, for example by means of trenches optionally filled with amorphous material. However, this lateral recrystallization may not be a problem if its extent is pre-planned (for example if the amorphous areas are much wider than they are thick, vertical recrystallization will be completed before lateral recrystallization has progressed very far. The connection between the two recrystallization fronts can then optionally be removed, as required).

The third constituent material of the second areas can be chosen from silicon or any other semiconductor material, such as germanium or one of its alloys with silicon, other silicon alloys such as SiC, or alloys of elements from columns III and V of the periodic table of the elements (for example GaAs), even columns II and VI, or diamond, quartz, LiTaO3, LiNbO3, and the like.

Thus the mixed layer can in particular be produced in a single material having, depending on the area, one or the other of two (or more) predefined crystal orientations. This is advantageously a mixed silicon layer that has, for example, a <100> or <110> orientation, depending on the area. Clearly it is recommended in this case to take care that lateral recrystallization phenomena do not disturb vertical recrystallization. It can be useful to prevent crystalline contact, for example by producing trenches optionally filled with amorphous material, at least to take account of this lateral recrystallization and for the latter not to disturb the final application of these substrates.

If the mixed layer is produced in the same material in the various areas, the formation of the amorphous second areas can be effected by rendering amorphous areas within an initially monocrystalline layer having the crystal orientation that is not that of the reference layer (namely that which the first areas will have at the end of producing the mixed layer).

It is clear, however, that the amorphous second layers can also be formed by excavating cavities in a monocrystalline layer (having the crystallography of the future first areas) and then filling these with a new material, which has the particular benefit of enabling mixed layers to be produced with areas which have not only different crystalline orientations but also different constituent materials. Forming the amorphous areas by deposition, even if they are produced in the same material as the rest of the mixed layer, can have the advantage of leading to less recrystallization of the amorphous layers starting from the adjacent layers, in that the formation of the amorphous areas by deposition induces much worse crystallographic compatibility with these adjacent areas than amorphization.

Note that the amorphous material can be deposited in an oven, onto several substrates (sometimes called wafers because they are disks with a diameter of several tens of centimeters, for example 30 cm). This is therefore a well-known collective treatment, and leads to reliable and fast production at moderate cost, which can constitute a significant advantage compared to the epitaxial technique.

Whether the second areas are produced by amorphization or by depositing amorphous material, the areas of the mixed layer advantageously have a thickness equal to that of this layer so that the free surface of the first substrate is itself mixed. Alternatively, the first areas of the mixed layer extend from the continuous electrically insulative layer through only a portion of the thickness of this mixed layer, the amorphous material being situated not only adjacent these first areas but also above them; because the amorphous material therefore lies above the first areas and the corresponding portions of the second areas, it extends continuously along the whole of the free surface of the first substrate; such a configuration corresponds to a situation in which the first substrate is formed from a first layer formed of the material of the first areas, cavities are excavated through the full thickness of this first layer, and an amorphous material is deposited in these cavities to form the second areas and to a given thickness on top of all of the first and second areas.

As indicated above, the second material (constituent material of the first areas of the mixed layer) can itself be amorphous, especially in the case of "high K" materials; the selective recrystallization of the amorphous second areas can then result from the choice of a recrystallization temperature and duration that are insufficient to cause significant recrystallization of the second material and/or the presence of a barrier layer formed when producing the areas of the mixed layer so as to maintain this amorphous material at a distance from any crystal seed able to determine the recrystallization.

Advantageously, the molecular bonding is hydrophobic, to prevent the formation of an oxide at the interface between the bonded surfaces (the conditions for such hydrophobic bonding are well known to the person skilled in the art). Nevertheless, hydrophilic, or even hydrophilic/hydrophobic, bonding is possible.

The recrystallization heat treatment is advantageously carried out at a temperature between 200° C. and 1300° C. inclusive, preferably between 350° C. and 800° C., depending on the materials used: depending on those materials, the duration of the treatment is typically between a few fractions of a second and a few hours (especially in the case of amorphous silicon).

Removing the crystal seed reference layer by separation from the mixed layer at least in the crystallized part can be effected by mechanical insertion of a tool (for example a blade) or a fluid (in particular gas or water), or by acoustic waves, at least within the fragile area constituted by (or in) the crystal seed layer (when it has been rendered porous, at least in part, or ions have been implanted in it) or by means of the bonding interface (if its bonding energy is low).

This removal can equally be obtained by thinning by mechanical and/or chemical polishing.

After separation, if any, of the mixed layer in the recrystallized part and the crystal seed layer, thermal annealing is advantageously applied to this mixed layer to eliminate from it any crystal defects still present, for example on encountering the recrystallization fronts (this annealing is advantageously carried out a temperature higher than the temperature at which recrystallization was effected).

Finishing steps can be useful for the structure obtained in this way, in order in particular to obtain a good surface state in terms of roughness, for example. These tests can be mechanical-chemical polishing, annealing in a reducing atmosphere, annealing in a vacuum, etc.

The starting substrate can be homogeneous, in which case the surface portions have the same properties (composition and structure) as the rest of the substrate. However, this starting substrate can be formed of a support to which a monocrystalline layer is fixed. After separation into two surface portions, one of them can be fixed to a support by molecular bonding; for example, a homogeneous silicon wafer can be separated, in a number of cycles, into a thin film (typically less than 1 micron thick) that is fixed to a support to form the substrate on which the mixed layer is formed, while the rest of the wafer serves as reference layer, before being detached and again separated into two portions.

BRIEF DESCRIPTION OF DRAWING

Objects, features and advantages of the invention emerge from the following description, given by way of nonlimiting illustration and with reference to the appended drawings, in which.

DETAILED DESCRIPTION

FIGS. 1 to 6 are general illustrations of the steps of a method of one embodiment of the invention.

Figure 1:
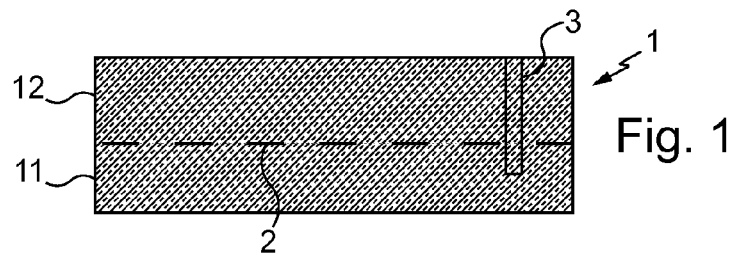
FIG. 1 is a view in section of a first, at least partly monocrystalline substrate intended to participate in the production of a hybrid substrate of the invention after separation into two parts.

FIG. 1 represents a first substrate 1 of a first material at least a first layer of which (here all of which) is monocrystalline. This substrate is for example a disk-shaped wafer known in the art.

This first substrate 1 has undergone beforehand treatment to weaken a layer 2 diagrammatically represented by a dashed line in the monocrystalline layer. This weakening can be obtained by ion implantation treatment, for example by implanting gas ions such as hydrogen and/or helium ions. Alternatively, this weakening can be effected by making a layer of the substrate 1 porous.

Registration marks 3 are created in the substrate 1 before or after the layer 2 is weakened; these registration marks are disposed on either side of this layer, in a given configuration relative to this layer, so that the faces of the two crystalline parts to be generated by fracture in the next step can be accurately aligned.

To this end, at least two alignment notches, advantageously at the border of the wafer and substantially diametrically opposed, can be produced by etching, for example. As shown in FIG. 1, these notches are deep enough to pass through the fragile layer: they will therefore be face to face in the portions of the substrate situated on either side of this layer 2 that are to be detached. Other registration marks can also be used, for example grooves produced on the edge of the substrate 1 and extending on either side of the fragile layer.

This first substrate is separated into two parts 11 and 12 by fracture along the weakened area 2, which lays bare the faces of two surface portions of this layer (in the present example, because the substrate is homogeneous, these surface portions extend to all this first substrate); because these surface portions result from fracture in the same monocrystalline area, they have the same crystallographic structure and can revert to the same crystal orientation if the registration marks come into the same configuration relative to the space between them (here in a face-to-face configuration) and the parallel faces are bonded together. Hereinafter, the parts of the registration marks on the first surface portion, thus the first part 11 of the first substrate, are denoted 3A while the parts of the registration marks on the second surface portion, thus the second part 12, are denoted 3B.

As indicated above, in the present example, the substrate 1, typically in silicon, is homogeneous, in particular, totally monocrystalline. Alternatively, the monocrystalline layer is carried by a support or even sandwiched between two supports. Consequently, one of the parts (even both parts) of the first substrate obtained after separation includes the monocrystalline material only in the immediate vicinity of the surfaces laid bare, thus in surface portions.

A polishing treatment can be applied to the surface of one or both of the surfaces laid bare provided that this treatment does not modify much if at all ($<10^{-5}$°) the angle between, on the one hand, the crystallographic planes most closely parallel to the surface and, on the other hand, the surface plane.

Figure 2:
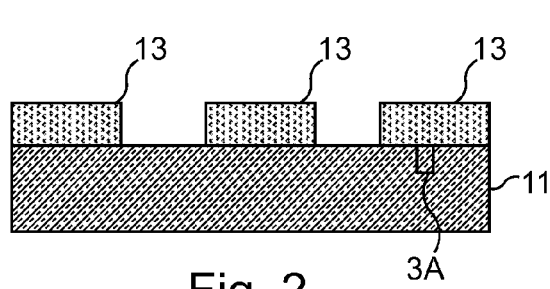
FIG. 2 is a view in section, after a first preparation step, of a temporary substrate including a first part of the first substrate.

FIG. 2 represents the result of a first step of preparing a temporary substrate; it shows, on one of the parts obtained by fracture of the substrate 1, here the part 11, a first family of areas 13; the surface of the part 11 that has been laid bare by fracture can have undergone a treatment known in the art to facilitate attachment of the areas 13. These areas are in a second material which, from the point of view of composition and/or crystal structure and/or crystal orientation, is different from that of the first substrate and thus different from that of the underlying part 11. In a preferred embodiment of the invention, these areas are produced by depositing and etching a layer of $SiO_2$.

Figure 3:
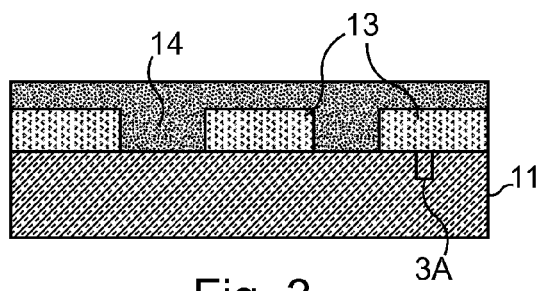
FIG. 3 is a view of the temporary substrate in section after the formation of a mixed layer, with one geometry example.

FIG. 3 represents the result of a second preparation step having led to the formation on the part 11 of a family of second areas 14 adjacent the first areas 13 and produced in a third material which, from the point of view of composition and/or crystal structure and/or crystal orientation, is different from the second constituent material of the first areas 13. These second areas 14 are amorphous.

These second areas 14 form at least part of the free surface of the temporary substrate. In the FIG. 3 example, the areas 14 are extended upward beyond the areas 13 and laterally toward each other, forming a continuous layer covering the areas 13: it can therefore be stated that the amorphous areas thus form the whole of the free surface of the temporary substrate (in other words, the whole of the free surface of the temporary substrate is formed of amorphous material).

By way of example, in the aforementioned case where the first substrate is in silicon, the first areas 13 are in $SiO_2$ and the constituent material of the amorphous layers is silicon (alternatively a silicon alloy, typically a silicon-germanium alloy).

Figure 4:
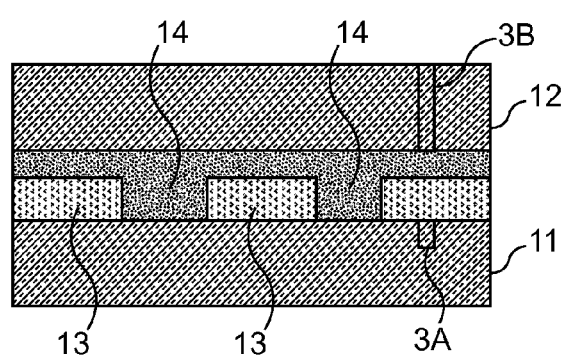
FIG. 4 is a view in section of a temporary assembly of this temporary substrate with the other part of the first substrate.

As indicated in FIG. 4, after surface preparation, if any, there follows molecular bonding to at least one of the amorphous areas of the face laid bare by fracture of the other part of the first substrate, namely the part 12. This bonding is effected taking care that this second part 12 has as accurately as possible the same crystal orientation as the first surface portion, thus the part 11, including in the plane of the surfaces laid bare during separation. To this end the registration marks produced before fracture, in particular when surface portions are available so that the marks 3A and 3B resume their original configuration relative to the mixed layer (clearly this relative configuration is of importance only parallel to the faces laid bare by fracture because it is as a function of the angular orientation of the laid bare faces, and not as a function of their separation, that there can be, or not, identity of the crystal orientations of the two surface portions. It is equally clear that the precise positioning of the two surface portions to obtain the same crystal orientation can be obtained independently of the presence of excavated or etched registration marks, even simply visually, especially if the manipulations to which each surface portion is subjected between their separation and their fastening on either side of the mixed layer is memorized.

There is then applied, at least to the mixed layer formed by the areas 13 and 14 (and possibly other areas if more than two families of areas have been formed between the two parts 11 and 12 of the first substrate), a heat treatment adapted to cause, selectively relative to the first areas 13, recrystallization in the solid phase of at least part of the amorphous areas 14; clearly this recrystallization is effected, not only according to the crystallized structure common to the two parts 11 and 12, but also according to their common crystal orientation; the effect of this is that, if recrystallization continues until the recrystallization fronts starting respectively from the part 11 and the part 12 join up, there is complete continuity on either side of these fronts. On the other hand, if recrystallization is not effected to the point of affecting all of the amorphous areas, it is nevertheless clear that the heat treatment has led to at least approximate symmetry between the high and low parts of the recrystallized amorphous areas relative to a non-recrystallized median portion, which in particular leads to good control of the geometry of the recrystallized amorphous areas in their top and bottom parts.

Figure 5:
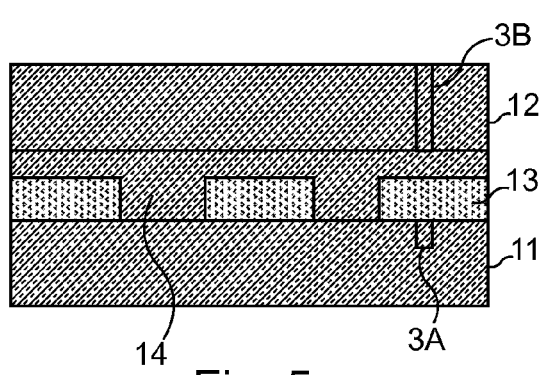
FIG. 5 is a view in section of this assembly after a recrystallization step.
Figure 6:
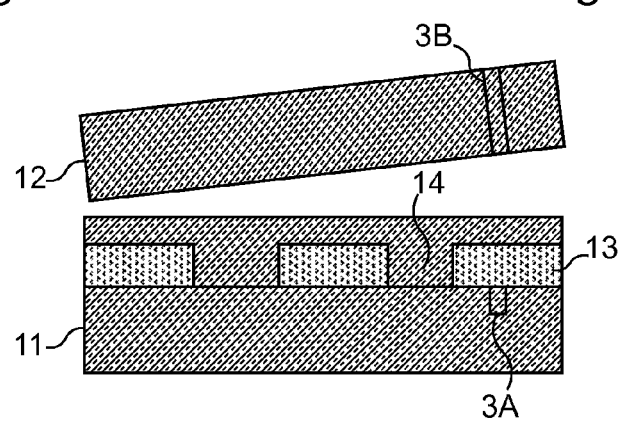
FIG. 6 is a view of this assembly after an advantageous step of separating the two parts of the first substrate.

If recrystallization is complete, the FIG. 5 configuration is obtained in this way, except that the frontiers between the layers 11 and 12, on the one hand, and the recrystallized amorphous areas, are in reality smoothed over because of the recrystallization from the layers 11 and 12. On the other hand, because of the continuity between the recrystallized parts on either side of the recrystallization fronts, the latter are not visible in practice.

It is to be noted that recrystallization is effected selectively with respect to the first areas 13 in the sense that this recrystallization is effected so as not to modify significantly the crystal structure of these areas 13 (including an amorphous structure). This can in particular be effected by choosing a treatment temperature and duration that have a much more significant effect on the areas 14 than on the areas 13, or again by providing, when preparing the areas 13, layers adapted to minimize any recrystallization conforming to the structure of a nearby material.

It then suffices, if required, to bring about lifting, preferably by separation, of one of the surface portions 11 or 12 relative to the at least partly recrystallized areas, here by separation at the bonding interface between the mixed layer and the layer 12.

The mixed layer typically has a thickness less than one micron, for example of the order of 60 nm (not including the layer on top of the areas 13).

In the example considered here, the part 11 of the first substrate constitutes by itself the support of the mixed layer, but it is clear that this part 11 can be no more than a thin layer with a thickness of hardly a few fractions of a micron, so that it is appropriate to attach it to a support, to obtain a self-supporting combination (it is often estimated that to achieve this a thickness of at least 700 microns is required); in this case, the temporary substrate includes this support, the thin film coming from the first substrate and the mixed layer.

Similarly, in this example considered here, the part 12 of the first substrate constitutes by itself the reference layer that is bonded, possibly temporarily, to the temporary substrate. Alternatively, this part can also be attached to a support.

Clearly this part 12 can then, after separation from the recrystallized areas, be used again for a new mixed layer production cycle by taking from it a thin layer which serves as the layer 11 during the new cycle.

Conversely, as a crystal seed for "top down" recrystallization, there could be used only a part of the layer 12, by using the aforementioned "Smart Cut™" technique to cut a layer that is attached to a support before bonding it to the free surface of the mixed layer.

This layer, together with its support, if any, typically has a thickness of 775 microns (for a diameter of 300 mm), so that it can be manipulated.

Figure 7:
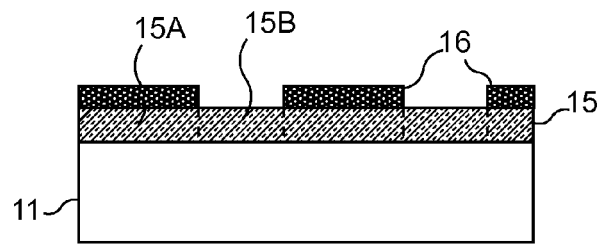
FIG. 7 is a view in section of a first example of a temporary substrate at an intermediate stage of its first preparation step.

FIG. 7 shows diagrammatically an example of preparing the mixed layer, with the deposition of a discontinuous mask 16 onto a layer 15 consisting of the material of the future first areas on the surface portion 11 obtained by fracture of the first substrate. This mask covers areas 15A that correspond to the future first areas 13. By etching through the mask 16, the layer 15 is excavated as far as the layer 11 in the areas 15B, amorphous material can then be deposited by any appropriate known means to fill these cavities and even to cover everything, arriving at the FIG. 3 configuration.

In FIG. 7 and the subsequent figures, registration marks have been omitted for simplicity.

Alternatively, if the areas 13 and 14 are intended to have the same composition but different crystal structures (or at least two different crystal orientations), the unmasked areas 15B are rendered amorphous by ion implantation (in this case, the amorphous material extends only to the side of the areas 15A and not on top).

Clearly the mask 16 can be formed in a number of elementary steps, entirely evident to the person skilled in the art. Generally speaking, this mask is formed by microlithographic operations known in the art. These are advantageously photolithographic masking operations.

Eliminating the mask frees the top surface of the missed layer to which the other part of the first substrate can then be bonded.

Note that in the example of FIGS. 1 to 5 the mixed layer obtained in this way at this stage includes families of areas 13 and 14 that have different thicknesses. Depending on requirements, an optional filling step can then be effected to obtain a mixed layer in which the areas 13 and 14 are the same thickness, as in the aforementioned case in which areas of an initially homogeneous layer are rendered amorphous. Alternatively, a weakening step, typically by ion bombardment (for example the Smart Cut™ technology) can be effected within the continuous layer on top of the first areas, which avoids having to eliminate this continuous layer by a thinning process if such elimination is required.

The thermal annealing intended to cause recrystallization can consist for example in a temperature ramp of 0.5° C./min between 200° C. and 1200° C.

Obtaining separation by separation at the bonding interface presupposes having bonded a material producing sufficient mechanical strength to guarantee that the reference layer 12 acts like a crystal seed for recrystallization during the heat treatment, but sufficiently weak to enable separation after this recrystallization without deterioration of the substrates, in particular the mixed layer. It must be remembered here that a recrystallization treatment is a heat treatment that in practice is carried out at a sufficiently high temperature to consolidate the molecular bonding, with the result that it must be taken into account when deciding on a compromise as to the molecular bonding operating conditions.

A number of types of treatment (chemical, heat, plasma, mechanical, and the like) will be evident to the person skilled in the art for preparing the surface of the reference layer and that of the mixed layer to render them compatible, from the flatness, roughness and chemical nature points of view, with such a molecular bonding step leading to a "demountable" interface compatible with transmission of the crystallographic information for good recrystallization.

For example, this roughening is conducted so that the roughness obtained is between 0.1 nm and 1 nm RMS.

This is optionally followed by surface treatment (chemical and/or heat and/or mechanical, and the like) to adapt the surface laid bare by demounting the interface after the treatment that the hybrid substrate is intended to have applied to it.

In a variant that is not shown this surface treatment can be replaced by a thinning treatment aiming to reduce the thickness of the mixed layer or the support substrate.

In another variant, the crystal seed layer 12 is weakened beforehand by appropriate ion implantation so as to locate the future separation outside the separation interface (this separation can also be localized in the continuous layer forming the surface of the mixed layer, if this continuous layer does not need to be preserved).

Clearly the FIG. 3 temporary substrate, after undergoing the FIG. 5 recrystallization (and where applicable the FIG. 6 separation), has become a mixed substrate having alternating SOI areas and vertical conduction areas.

It is clear that in an analogous way a mixed substrate can be prepared having three (or more) families of areas, rather than two families. It has been stated that recrystallization need not be complete, at least before separation (when used). Thus the recrystallization thermal annealing can be effected in two (or more) steps, including a first step sufficient to cause recrystallization of part, possibly a small part, of the thickness of the amorphous areas from the interface. After separation, the recrystallization of the rest of the amorphous layers can be obtained in one or more steps using the recrystallized parts as crystal seeds for the rest of the amorphous area. The first step is for example a steeper ramp than the one referred to above.

It is clear that proceeding in two steps in particular reduces the total calorific energy (the second step, after separation, involving a mass less than the first, because the layer 12 is no longer involved).

In the above example, the first areas 13 are in SiO2. They can instead be in other amorphous materials such as an oxide, a nitride, alumina, carbon or a "high K" material (having a high dielectric constant).

They could equally be in a crystalline material different from that of the areas 14 or to the contrary identical to that of the recrystallized areas 14 but with a different crystalline orientation. The crystalline materials include silicon or any other semiconductor material, such as germanium, one of its alloys with silicon, other silicon alloys such as SiC, alloys of elements from columns III and V of the periodic table of the elements (for example GaAs), or even columns II and VI, or diamond, quartz, LiTaO3, LiNbO3, etc. In this case, to limit recrystallization according to the crystal structure of the first areas 13 from the interface between these first areas 13 and the continuous layer of material of the underlying areas 14 there can be deposited onto the areas 13 a thin amorphous layer (for example of SiO2) that can if appropriate be eliminated at the time of thinning the mixed layer after recrystallization.

Clearly there are many ways for the heat treatment to cause recrystallization of the areas 14, selectively with respect to the areas 13, regardless of their crystal structure (where applicable their amorphous structure); it can furthermore be advantageous to provide trenches for separating the areas 13 and the areas 14; these trenches could optionally be filled with an amorphous material.

FIGS. 8 to 11 represent another way of implementing the general method of FIGS. 1 to 5 (or even 6) also avoiding underlying recrystallization from the first areas 13 when these are crystalline.

In this example, the first substrate is in monocrystalline silicon with <100> orientation. One of the parts obtained by separation of the first substrate is a layer 111 mounted on a support 110 of any composition, for example polycrystalline silicon (possibly covered with a thermal oxide layer).

There is transferred onto this layer 111, for example by implantation and fracture, a layer 112 part of which is intended to form part of the future mixed layer; as in one of the previous examples, this is monocrystalline silicon of <110> orientation.

Figure 8:
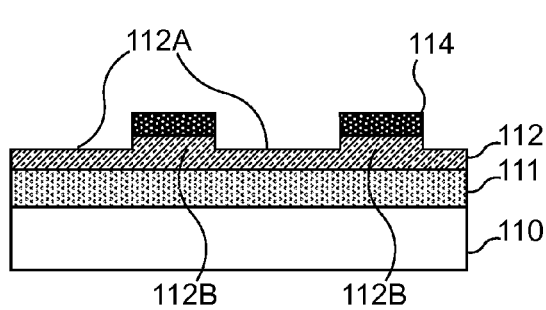
FIG. 8 is a view in section of a second example of a temporary substrate at an intermediate stage of its first preparation step.

Unlike FIG. 7, the first preparation step shown diagrammatically in FIG. 8 includes the formation of a first discontinuous mask 114 covering the areas 112B intended to change crystallography; moreover, this first step includes thinning the unmasked areas 112A. Of course, this thinning, which corresponds in FIG. 8 to a reduction of about half the initial thickness of the layer 112, can be more moderate.

Figure 9:
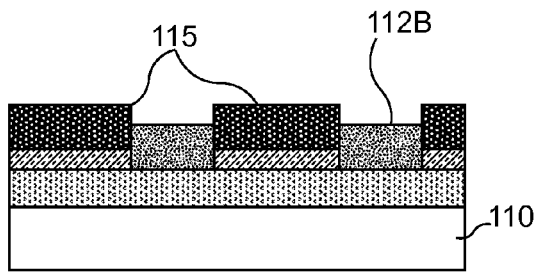
FIG. 9 is a view in section of this second example of a temporary substrate at a later stage of its first preparation step.

FIG. 9 shows diagrammatically a second step in which, in combination with the elimination of the mask 114, a discontinuous second mask 115 is formed covering the areas 112A intended to retain their crystalline orientation and the unmasked areas are rendered amorphous; given the first step from FIG. 8, these areas are rendered amorphous over a thickness that is greater than the thickness of the masked areas 112A (the initial thickness of the layer 112). The mask 115 is then removed; these various microlithography steps are in themselves well known to the person skilled in the art.

At this stage the first substrate includes areas 112B that have been rendered amorphous that project relative to areas 112A that have remained intact from the crystallographic point of view; trenches are advantageously formed between these areas 112A and 112B in order to separate them from a crystallographic point of view (these trenches can be empty or contain another amorphous material).

Figure 10:
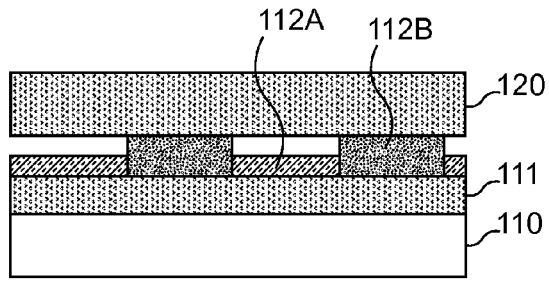
FIG. 10 is a view of this second example of a temporary substrate after formation of the mixed layer and assembly to the other part of the first substrate.
Figure 11:
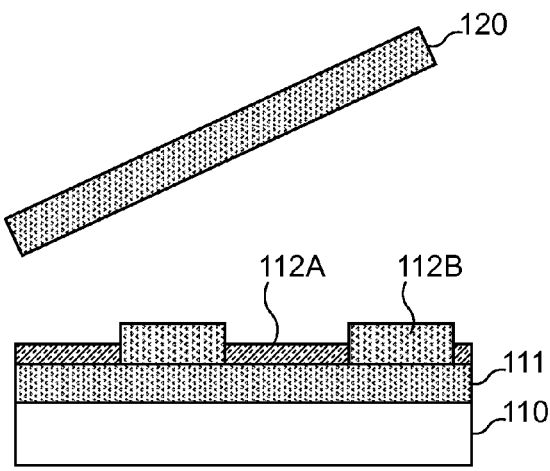
FIG. 11 is a view in section of the assembly from FIG. 10 after recrystallization and separation.

It is thus clear (see FIG. 10) that, with the aid of alignment marks, if any, (not shown) placing the temporary substrate in contact with the second part 120 of the first substrate is effected only via the free surface of these areas rendered amorphous; this avoids any unwanted reactions at the facing surfaces of the first areas 112A and the reference layer 120 during the recrystallization thermal annealing (FIG. 10). Furthermore, this facilitates any subsequent separation of the part 120 from the temporary substrate, now in part recrystallized (see FIG. 11).

The same optional operations can then be carried out as in the first example. In practice, polishing (or any other smoothing treatment, for example annealing in H2, vacuum annealing, and the like) to make good the difference in level between the free surfaces of the areas 112A and 112B is recommended; it is nevertheless possible for this difference to be exploited, for example to produce components or parts of components.

Thus this second embodiment of the invention differs from the first in that the molecular bonding is limited to the areas that are to be recrystallized, which tends to protect the areas that are to retain their crystallography.

As in the first example, the recrystallization annealing can be carried out in two steps separated by the separation step.

As before, optional steps of any appropriate type (chemical, thermal, plasma, mechanical, and the like) of preparing the free surface of the temporary substrate are effected to render this free surface compatible with demountable molecular bonding with the second substrate 120.

A hybrid substrate is obtained in this way, in particular enabling the simultaneous production of field-effect transistors of nFET type (in the areas with orientation <100>) and pFET type (in the areas with orientation <110>).

Clearly obtaining good control of the mechanical strength of the interface between the two substrates is facilitated here by the fact that, at this bonding interface, the first substrate is formed entirely of a single homogeneous material.

As before, recrystallization can be effected in a number of steps.

The invention claimed is:

1. A method of producing a hybrid substrate comprising:
   preparing a first substrate having at least one monocrystalline layer of a first material;
   separating the first substrate into first and second substrate parts, such that each of the first and second substrate parts has a surface, and such that a crystalline axis of each surface substantially coincides upon separation;
   preparing a temporary substrate by forming, directly on the surface of the first substrate part, a mixed layer comprising first areas of at least one second material, the first areas having a difference of composition or crystallographic form with respect to the first material, and adjacent second areas of an amorphous third material, the second areas having one or both of a different composition or crystallographic form with respect to the first areas and form at least part of a free surface of the temporary substrate;
   bonding the temporary substrate, by molecular bonding over at least the second areas of the free surface of the temporary substrate, to the surface of the second substrate part, so that the second areas are in contact with the first and second substrate parts and the surface of the second substrate part has the same crystal orientation as the surface of the first substrate part; and
   applying a heat treatment to at least the mixed layer that is adapted to cause, selectively with respect to the first areas, a solid phase recrystallization of at least part of the second areas according to the common crystal orientation of the two surfaces of the first and second substrate parts.

2. The method according to claim 1 further comprising:
   before separating the first substrate, producing registration marks in the first substrate on either side of a weakened layer, in accordance with a relative configuration given with respect to the weakened layer; and
   aligning the registration marks with respect to the relative configuration and relative to the mixed layer prior to bonding the second substrate part to the temporary substrate.

3. The method according to claim 1 further comprising, after bonding the temporary substrate to the second substrate part, removing at least part of at least the first or second substrate part.

4. The method according to claim 3, wherein removing comprises separating the surface of the first or second substrate from the at least partly recrystallized second areas of the mixed layer.

5. The method according to claim 4 further comprising roughening at least one of the surfaces to be bonded by molecular bonding prior to the molecular bonding, and wherein separating the surface comprises separating at a molecular bonding interface.

6. The method according to claim 4, further comprising preparing the surface of the second substrate part so as to reduce its mechanical strength in proximity to the molecular bonding interface.

7. The method according to claim 6, wherein preparing the surface of the second substrate part comprises ion implantation to a given depth, and wherein separating comprises separating at the given depth.

8. The method according to claim 4, wherein applying the heat treatment comprises recrystallizing only part of the second areas, and wherein the method further comprises applying a second heat treatment to complete the recrystallization of the second areas after separating the surface of the first or second substrate part.

9. The method according to claim 1, wherein forming the mixed layer comprises forming the first and second areas of material having an identical composition.

10. The method according to claim 1, wherein forming the mixed layer comprises forming the first and second areas of material having a common element.

11. The method according to claim 1, wherein forming the mixed layer comprises forming the first and second areas of a single material, wherein each area has a predefined crystal orientation.

12. The method according to claim 11, wherein forming the second areas comprises forming a monocrystalline layer initially having the same crystal orientation as the first areas, and rendering the monocrystalline layer amorphous.

13. The method according to claim 1, wherein forming the mixed layer comprises forming the second areas by excavating a monocrystalline layer initially having the same crystal orientation as the first areas to form cavities, and depositing an amorphous material in the cavities.

14. The method according to claim 13, wherein depositing the amorphous material comprises forming a layer covering the first areas.

15. The method according to claim 1, wherein forming the mixed layer comprises forming the first and second areas with silicon.

* * * * *